(12) United States Patent
Perreault et al.

(10) Patent No.: US 7,535,133 B2
(45) Date of Patent: May 19, 2009

(54) METHODS AND APPARATUS FOR RESISTANCE COMPRESSION NETWORKS

(75) Inventors: David J. Perreault, Brookline, MA (US); Juan M. Rivas, Auburndale, MA (US); Yehui Han, Cambridge, MA (US); Olivia Leitermann, Arlington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 345 days.

(21) Appl. No.: 11/381,418

(22) Filed: May 3, 2006

(65) Prior Publication Data

US 2007/0064457 A1 Mar. 22, 2007

Related U.S. Application Data

(60) Provisional application No. 60/677,785, filed on May 3, 2005.

(51) Int. Cl.
*G05F 3/06* (2006.01)
(52) U.S. Cl. ...................................... 307/151
(58) Field of Classification Search ............ 307/98, 307/151
See application file for complete search history.

(56) References Cited

U.S. PATENT DOCUMENTS

| 5,708,573 | A | * | 1/1998 | Lusher et al. ............ 363/47 |
| 6,600,384 | B2 | * | 7/2003 | Mohwinkel et al. ...... 333/22 R |
| 6,887,339 | B1 | | 5/2005 | Goodman et al. |
| 2004/0027209 | A1 | | 2/2004 | Chen et al. |

FOREIGN PATENT DOCUMENTS

| GB | 1506633 | 4/1978 |
| WO | WO 0067373 A1 | 11/2000 |

OTHER PUBLICATIONS

Juan M. Rivas, Riad S. Wahby, John S. Shafran, David J. Perreault, New Architectures for Radio-Frequency dc/dc Power Conversion, Jun. 2004, pp. 4074-4084, vol. 15, Aachen, Germany.
PCT/US2006/016981 International Search Report dated Dec. 29, 2006.

* cited by examiner

*Primary Examiner*—Robert L. Deberadinis
(74) *Attorney, Agent, or Firm*—Daly, Crowley, Mofford & Durkee, LLP

(57) ABSTRACT

A resistance compression network substantially decreases the variation in effective resistance seen by a tuned rf inverter as loading conditions change. Circuits can include resistance compression networks and rectifiers to form rf-to-dc converters having narrow-range resistive input characteristics.

27 Claims, 15 Drawing Sheets

| Component Name | Nominal Value | Manufacturer and Part Style | Part Number | Measured Value |
|---|---|---|---|---|
| $C_{C1}$ | 18pF<br>+15pF | CDE Chip-<br>Mica 100V | MC08EA180J<br>MC08EA150J | 36.22pF |
| $C_{C2}$ | 56pF<br>+7pF | CDE Chip-<br>Mica 100V | MC12FA560J<br>MC08CA070C | 66.5pF |
| $C_{extra}$ | 10pF x 2 | CDE Chip-<br>Mica 100V | MC08CA100D | |
| $C_{in}$ | 2.2µF<br>+0.63µF<br>+0.047µF x 12 | Tantalum 35V<br>Tantalum 35V<br>Ceramic 50V | PCT6225CT<br>PCT6684CT<br>Kemet | |
| $C_R$ | 82pF<br>+2pF | CDE Chip-<br>Mica 100V | MC12FA8205<br>MC08CA020D | |
| $C_{RL}, C_{R2}$ | 15pF x 2 | CDE Chip-<br>Mica 100V | MC08EA150J | $C_{R1}$=32.6pF<br>$C_{R2}$=32pF |
| $C_{out}$ | 0.1µF x 19 | Kemet<br>Ceramic 50V | C0805C104MSUAC | |
| $D_1, D_2$ | Schottky<br>Power Diode | ON Semi<br>60V, 2.0A | MBRS260T3 | |
| $L_1$ | 17.5pH | Coilcraft | B06T6 | |
| $L_{C1}$ | 33nH | Coilcraft | 1812SMS-33N | 38.1nH |
| $L_{C2}$ | 68nH | Coilcraft | 1812SMS-68N | 69.9nH |
| $L_{choke}$ | 120nH x 2 | Coilcraft | 1812SMS-R12G | |
| LDMOS | | Freescale<br>70V (max $V_{ds}$) | MRF373ALSR1 | |
| $L_R$ | 12.5nH<br>+ Two-turn<br>magnet wire coil<br>+8.9nH board parasitic | Coilcraft | A04TJ<br>18 AWG | Approx.<br>22nH |
| $L_{RL}, L_{R2}$ | 18.5nH | Coilcraft | A05T | $L_{R1}$=18.9nH<br>$L_{R2}$=18.7nH |

METHODS AND APPARATUS FOR RESISTANCE COMPRESSION NETWORKS

CROSS REFERENCE TO RELATED APPLICATIONS

The present application claims the benefit of U.S. Provisional Patent Application No. 60/677,785, filed on May 3, 2005, which is incorporated herein by reference.

STATEMENT REGARDING FEDERALLY SPONSORED RESEARCH

The Government may have certain rights in the invention pursuant to Contract No. N000140010381 with the ONR.

BACKGROUND

As is known in the art, one way to improve performance and reduce the size of power electronics is through increasing switching frequency. Resonant dc/dc power converters enable higher switching frequencies than can be achieved with conventional pulse-width modulated circuits, due to their natural soft-switched operation and ability to absorb and utilize circuit parasitics in the conversion process. For example, efficient resonant dc/dc power conversion has been demonstrated at frequencies in excess of 100 MHz, and operation at much higher switching frequencies is feasible.

A limitation of known resonant converter circuits is the sensitivity of the inverter stage to loading conditions. Switched-mode radio-frequency (rf) inverters suitable for ultra-high frequencies (e.g., classes DE, E, and F) exhibit high sensitivity to the effective impedance of the load. For example, class E inverters only operate under soft-switched conditions over about a factor of two in load resistance. While acceptable in communications applications (in which the load resistance is relatively constant), this is problematic for many dc/dc power converter applications, where the effective resistance presented by the matching stage and rectifier varies greatly with output voltage and current. This problem is particularly severe in applications in which the voltage conversion ratio varies substantially; such applications include charging systems where the converter must deliver constant power over a wide output voltage range and regulating converters where the converter must operate over a wide input voltage range and/or the same converter design must be capable of supporting a range of output voltages.

SUMMARY

Exemplary embodiments of the invention provide methods and apparatus for a resistance compression network that reduces sensitivity to loading conditions. With this arrangement, the variation in effective resistance seen by a tuned rf inverter, for example, is decreased. While the inventive embodiments are shown and described in conjunction with particular circuit configurations and applications, it is understood that the invention is applicable to a variety of circuits and applications in general in which it is desirable to reduce sensitivity to loading conditions.

In one aspect of the invention, a circuit comprises a resistance compression network including an input port, a first output port for coupling to a first load, a second output port for coupling to a second load, a reactive network coupled to the first input port, the first output port, and the second output port, wherein at a first frequency an equivalent resistance of the compression network input port varies over a first ratio as equivalent resistances of the first and second loads vary together over a second ratio which is larger than the first ratio.

In one embodiment, a circuit comprises a resistance compression network including an input port, a first output port for coupling to a first load, a second output port for coupling to a second load, a reactive network coupled to the first input port, the first output port, and the second output port, wherein at a first frequency an equivalent resistance of the compression network input port varies over a first ratio as equivalent resistances of the first and second loads vary together over a second ratio which is larger than the first ratio, wherein the reactive network includes a first reactive branch in series with the first load, and a second reactive branch in series with the second load, wherein the reactances of the first and second reactive branches are substantially equal in magnitude and opposite in sign at the first frequency.

In another embodiment, a circuit comprises a resistance compression network including an input port, a first output port for coupling to a first load, a second output port for coupling to a second load, a reactive network coupled to the first input port, the first output port, and the second output port, wherein at a first frequency an equivalent resistance of the compression network input port varies over a first ratio as equivalent resistances of the first and second loads vary together over a second ratio which is larger than the first ratio, wherein the reactive network includes a first reactive branch in series with the first load, and a second reactive branch in series with the second load, wherein the reactances of the first and second reactive branches are substantially equal in magnitude and opposite in sign at the first frequency, wherein the first terminal of the first reactive branch and a first terminal of the second reactive branch are each coupled to a first terminal of the input port, a second terminal of the first reactive branch is coupled to a first terminal of the first load, a second terminal of the second reactive branch is coupled to a first terminal of the second load, and a second terminal of the first load and a second terminal of the second load are each coupled to a second terminal of the input port.

In one embodiment, a circuit comprises a resistance compression network including an input port, a first output port for coupling to a first load, a second output port for coupling to a second load, a reactive network coupled to the first input port, the first output port, and the second output port, wherein at a first frequency an equivalent resistance of the compression network input port varies over a first ratio as equivalent resistances of the first and second loads vary together over a second ratio which is larger than the first ratio, wherein the reactive network includes a first reactive branch in series with the first load, and a second reactive branch in series with the second load, wherein the reactances of the first and second reactive branches are substantially equal in magnitude and opposite in sign at the first frequency, wherein the reactive network includes a third reactive branch in parallel with the series connection of the first reactive branch and the first load, and a fourth reactive branch in parallel with the series connection of the second reactive branch and the second load, wherein the reactances of the third and fourth reactive branches are substantially equal in magnitude and opposite in sign at the first frequency.

In an exemplary embodiment, a circuit comprises a resistance compression network including an input port, a first output port for coupling to a first load, a second output port for coupling to a second load, a reactive network coupled to the first input port, the first output port, and the second output port, wherein at a first frequency an equivalent resistance of the compression network input port varies over a first ratio as equivalent resistances of the first and second loads vary together over a second ratio which is larger than the first ratio, wherein the reactive network further includes a first reactive branch in parallel with the first load, and a second reactive branch in parallel with the second load, wherein the reactances of the first and second branches are substantially equal in magnitude and opposite in sign at the first frequency.

In another embodiment, a circuit comprises a resistance compression network including an input port, a first output port for coupling to a first load, a second output port for coupling to a second load, a reactive network coupled to the first input port, the first output port, and the second output port, wherein at a first frequency an equivalent resistance of the compression network input port varies over a first ratio as equivalent resistances of the first and second loads vary together over a second ratio which is larger than the first ratio, wherein the reactive network further includes a first reactive branch in parallel with the first load, and a second reactive branch in parallel with the second load, wherein the reactances of the first and second branches are substantially equal in magnitude and opposite in sign at the first frequency, wherein the reactive network further includes a third reactive branch in series with the parallel connection of the first reactive branch and the first load, and a fourth reactive branch in series with the parallel connection of the second reactive branch and the second load, wherein the reactances of the third and fourth reactive branches are substantially equal in magnitude and opposite in sign at the specified operating frequency.

In a further embodiment, a circuit comprises a resistance compression network including an input port, a first output port for coupling to a first load, a second output port for coupling to a second load, a reactive network coupled to the first input port, the first output port, and the second output port, wherein at a first frequency an equivalent resistance of the compression network input port varies over a first ratio as equivalent resistances of the first and second loads vary together over a second ratio which is larger than the first ratio, wherein the reactive network further includes a first reactive branch in parallel with the first load, and a second reactive branch in parallel with the second load, wherein the reactances of the first and second branches are substantially equal in magnitude and opposite in sign at the first frequency, wherein the first terminal of the first reactive branch and a first terminal of the first load are each coupled to a first terminal of the input port, a first terminal of the second reactive branch and a first terminal of the second load are each coupled to a second terminal of the input port, and a second terminal of the first reactive branch, a second terminal of the first load, a second terminal of the second reactive branch and a second terminal of the second load are coupled together.

In another aspect of the invention, a circuit comprises an inverter circuit, a resistance compression network including an input port and first and second output ports, and a reactive network, the input port coupled to the inverter circuit, the reactive network coupled to the first input port and the first and second output ports, and a first rectifier coupled to the first output port and a second rectifier coupled to the second output port, wherein at a first frequency an equivalent resistance of the compression network input port varies over a first ratio as equivalent resistances of the first and second rectifiers vary together over a second ratio which is larger than the first ratio.

In a further aspect of the invention, a method comprises providing a resistance compression network including a reactive network, the compression network having an input port and first and second output ports coupled to the reactive network, the first output port being adapted for coupling to a first load and the second output port being adapted for coupling to a second load, wherein at a first frequency an equivalent resistance of the compression network input port varies over a first ratio as equivalent resistances of the first and second loads vary together over a second ratio which is larger than the first ratio.

In one embodiment, the method further includes coupling a first reactive branch in series with the first load, and a second reactive branch in series with the second load, wherein the reactances of the first and second reactive branches are substantially equal in magnitude and opposite in sign at the first frequency.

In another embodiment, a method comprises providing a resistance compression network including a reactive network, the compression network having an input port and first and second output ports coupled to the reactive network, the first output port being adapted for coupling to a first load and the second output port being adapted for coupling to a second load, wherein at a first frequency an equivalent resistance of the compression network input port varies over a first ratio as equivalent resistances of the first and second loads vary together over a second ratio which is larger than the first ratio, coupling a first reactive branch in series with the first load, and a second reactive branch in series with the second load, wherein the reactances of the first and second reactive branches are substantially equal in magnitude and opposite in sign at the first frequency, and further including coupling a third reactive branch in parallel with the series connection of the first reactive branch and the first load, and a fourth reactive branch in parallel with the series connection of the second reactive branch and the second load, wherein the reactances of the third and fourth reactive branches are substantially equal in magnitude and opposite in sign at the first frequency.

In a further embodiment, a method comprises providing a resistance compression network including a reactive network, the compression network having an input port and first and second output ports coupled to the reactive network, the first output port being adapted for coupling to a first load and the second output port being adapted for coupling to a second load, wherein at a first frequency an equivalent resistance of the compression network input port varies over a first ratio as equivalent resistances of the first and second loads vary together over a second ratio which is larger than the first ratio, coupling a first reactive branch in series with the first load, and a second reactive branch in series with the second load, wherein the reactances of the first and second reactive branches are substantially equal in magnitude and opposite in sign at the first frequency, and further including coupling a first terminal of the first reactive branch and a first terminal of the second reactive branch to a first terminal of the input port, coupling a second terminal of the first reactive branch to a first terminal of the first load, coupling a second terminal of the second reactive branch to a first terminal of the second load, and coupling a second terminal of the first load and a second terminal of the second load to a second terminal of the input port.

In a further embodiment, a method comprises providing a resistance compression network including a reactive network, the compression network having an input port and first and second output ports coupled to the reactive network, the first output port being adapted for coupling to a first load and the second output port being adapted for coupling to a second load, wherein at a first frequency an equivalent resistance of the compression network input port varies over a first ratio as equivalent resistances of the first and second loads vary together over a second ratio which is larger than the first ratio, and further including coupling a first reactive branch in parallel with the first load, and a second reactive branch in parallel with the second load, wherein the reactances of the first and second branches are substantially equal in magnitude and opposite in sign at the first frequency.

In one embodiment, a method comprises providing a resistance compression network including a reactive network, the compression network having an input port and first and second output ports coupled to the reactive network, the first output port being adapted for coupling to a first load and the second output port being adapted for coupling to a second load, wherein at a first frequency an equivalent resistance of the compression network input port varies over a first ratio as equivalent resistances of the first and second loads vary together over a second ratio which is larger than the first ratio, and further including coupling a first reactive branch in parallel with the first load, and a second reactive branch in parallel with the second load, wherein the reactances of the first and second branches are substantially equal in magnitude and opposite in sign at the first frequency, and further including coupling a third reactive branch in series with the parallel connection of the first reactive branch and the first load, and a fourth reactive branch in series with the parallel connection of the second reactive branch and the second load, wherein the reactances of the third and fourth reactive branches are substantially equal in magnitude and opposite in sign at the specified operating frequency.

In another embodiment, a method comprises providing a resistance compression network including a reactive network, the compression network having an input port and first and second output ports coupled to the reactive network, the first output port being adapted for coupling to a first load and the second output port being adapted for coupling to a second load, wherein at a first frequency an equivalent resistance of the compression network input port varies over a first ratio as equivalent resistances of the first and second loads vary together over a second ratio which is larger than the first ratio, and further including coupling a first reactive branch in parallel with the first load, and a second reactive branch in parallel with the second load, wherein the reactances of the first and second branches are substantially equal in magnitude and opposite in sign at the first frequency, the method further including coupling a first terminal of the first reactive branch and a first terminal of the first load to a first terminal of the input port, coupling a first terminal of the second reactive branch and a first terminal of the second load to a second terminal of the input port, and coupling together a second terminal of the first reactive branch, a second terminal of the first load, a second terminal of the second reactive branch and a second terminal of the second load.

In another aspect of the invention, a circuit comprises a resistance compression network having an input port and first and second output ports, the first output port to drive a first load and the second output port to drive a second load, the first input port having an input impedance at a first frequency that varies a first amount as impedances of the first and second loads vary substantially together by a second amount that is greater than the first amount.

BRIEF DESCRIPTION OF THE DRAWINGS

The foregoing features of this invention, as well as the invention itself, may be more fully understood from the following description of the drawings in which:

FIG. 15A is tabular representation of component information for the circuit of FIG. 15;

DETAILED DESCRIPTION

Figure 1:
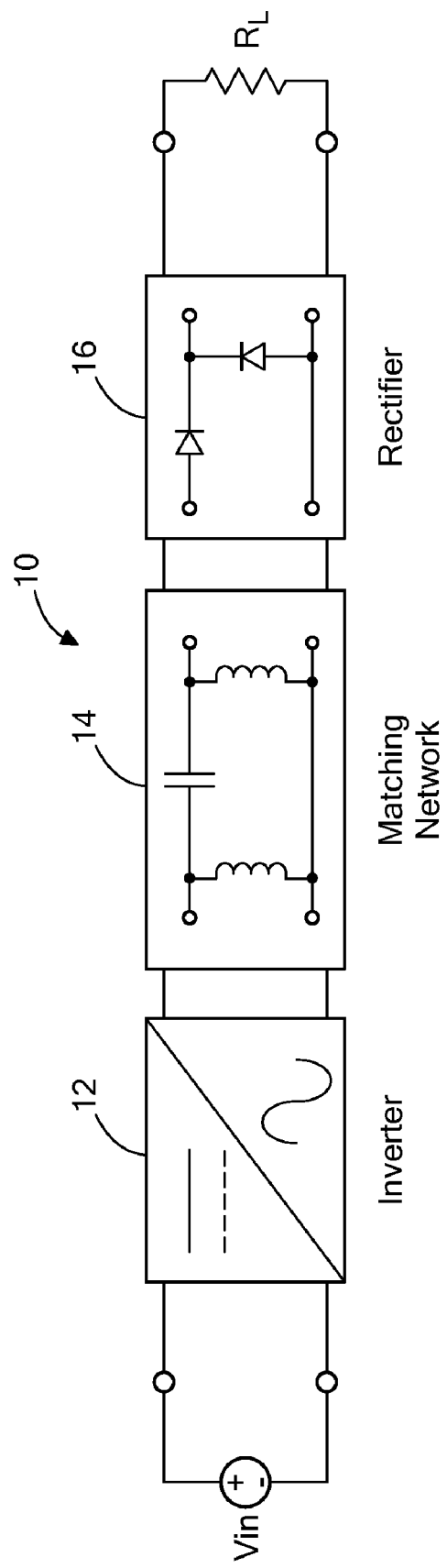
FIG. 1 is a block diagram of a portion of a resonant dc-dc converter having a transformation stage in accordance with exemplary embodiments of the invention.

FIG. 1 shows a high-frequency resonant dc/dc converter 10 having a resistance compression network in accordance with exemplary embodiments of the invention. The converter includes an inverter stage 12, a transformation stage 14, and a rectifier stage 16. The inverter stage 12 draws dc input power and delivers ac power to the transformation stage 14. Inverters suitable for extremely high frequencies operate resonantly, and take advantage of the characteristics of the load to achieve zero-voltage switching (ZVS) of the semiconductor device(s).

The rectifier stage 16 takes ac power from the transformation stage 14 and delivers dc power to the output load $R_L$. In addition to conventional rectifier topologies, resonant converters can take advantage of a variety of resonant rectifiers. The system may be designed such that the rectifier stage appears resistive in a describing function sense and is matched to the inverter by the action of the transformation stage 14. The transformation stage 14 develops this impedance match to provide voltage and current level transformation, and in some cases to provide electrical isolation, as described in detail below.

The inventive matching/transformation network 14 significantly reduces the load sensitivity of tuned rf power inverters. These networks, which are termed resistance compression networks, serve to greatly reduce the variation in effective resistance seen by a tuned rf inverter as loading conditions change.

Compression networks ideally act without loss, such that energy provided at the input port is transformed and transferred to the resistive load. In effect, the load resistance range appears compressed when looking through a resistance compression network. This effect can be used to overcome deficiencies of tuned radio frequency circuits for power applications and to expand the range of applications for which high-frequency resonant power conversion is viable.

Figure 2B:
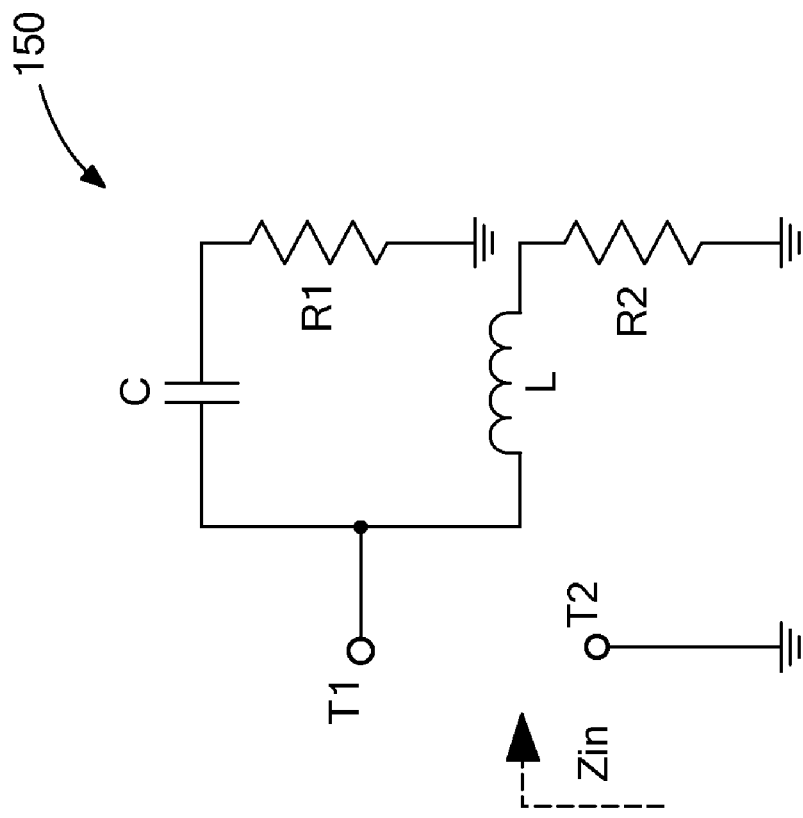
FIGS. 2A and 2B are circuit diagrams of resistance compression networks.
Figure 2A:
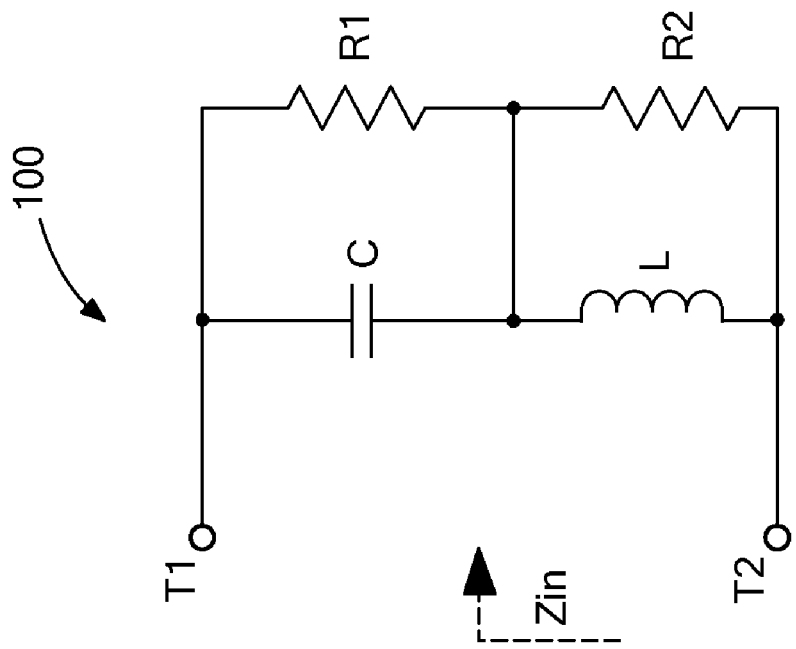

FIGS. 2A and 2B show exemplary first and second resistance compression circuits 100, 150, respectively, in accordance with exemplary embodiments of the invention. Each of these circuits 100, 150 provides compression in apparent input resistance. The first circuit 100 includes first and second input terminals T1, T2 across with first and second resistors R1, R2 are coupled end to end. In one embodiment, the resistors R1, R2 have the same resistance value, i.e., are matched resistors. A capacitor C is coupled across the first resistor R1 and an inductor L is coupled across the second resistor R2. The capacitor C and inductor L form a resonant LC tank circuit.

The second circuit 150 also includes a resonant LC tank circuit with matched resistors R1, R2. A first circuit path extends from the first input terminal T1, to the capacitor C, the first resistor R1, to ground. A second circuit path extends from the first input terminal T1, to the inductor L, to the second resistor R2, to ground.

For the circuits 100, 150, at the resonant frequency of the LC tank, the input resistance Rin varies over a narrow range as the matched resistors R1, R2 vary over a wide range (geometrically centered on the tank characteristic impedance). The circuits 100, 150 achieve lossless energy transfer from the input port to the resistors R1, R2.

TABLE I

CHARACTERISTICS OF THE RESISTANCE COMPRESSION NETWORK OF FIG. 2(A).

| Ratio of R range | Range of R | Ratio of $R_{in}$ range | Range of $R_{in}$ |
|---|---|---|---|
| 100:1 | $0.1Z_0$ to $10Z_0$ | 5.05:1 | $0.198Z_0$ to $Z_0$ |
| 10:1 | $0.316Z_0$ to $3.16Z_0$ | 1.74:1 | $0.575Z_0$ to $Z_0$ |
| 4:1 | $0.5Z_0$ to $2Z_0$ | 1.25:1 | $0.8Z_0$ to $Z_0$ |
| 2:1 | $0.707Z_0$ to $1.41Z_0$ | 1.06:1 | $0.94Z_0$ to $Z_0$ |

When either of these circuits 100, 150 is driven at the resonant frequency $$\omega_0 = \frac{1}{\sqrt{LC}}$$

of its LC tank, it presents a resistive input impedance Rin that varies only a relatively small amount as the matched load resistances R1, R2 vary across a wide range.

For example, for the circuit of FIG. 2(a), the input resistance is:

$$R_{in} = \frac{2R}{1 + \left(\frac{R}{Z_0}\right)^2} \quad (1)$$

in which $$Z_0 = \sqrt{\frac{L}{C}}$$

is the characteristic impedance of the tank, and R is the resistance of R1 and R2. For variations of R over a range having a geometric mean of $Z_0$ (that is, $$R \in \left[\frac{Z_0}{c}, cZ_0\right]$$

where c is a constant that defines the span of the resistance range) the variation in input resistance $R_{in}$ is smaller than the variation in load resistance R. The amount of "compression" that is achieved for this case (around a center value of impedance $Z_c=Z_0$) is illustrated in Table I. For example, a 100:1 variation in R around the center value results in only a 5.05:1 variation in Rin, and a 10:1 variation in load resistance results in a modest 1.74:1 variation in Rin. Furthermore, because the reactive components are ideally lossless, energy driven into the resistive input of the compression network is transformed in voltage and transferred to the load resistors. Thus, the compression network can efficiently function to match a source to the load resistors, despite large (but identical, or substantially identical) variations in the load resistors.

For the circuit of FIG. 2B, the input resistance at resonance is:

$$R_{in} = \frac{Z_0^2}{2R}\left[1 + \left(\frac{R}{Z_o}\right)^2\right] \quad (2)$$

which represents the same degree of compression as R varies about $Z_0$.

Figure 3B:
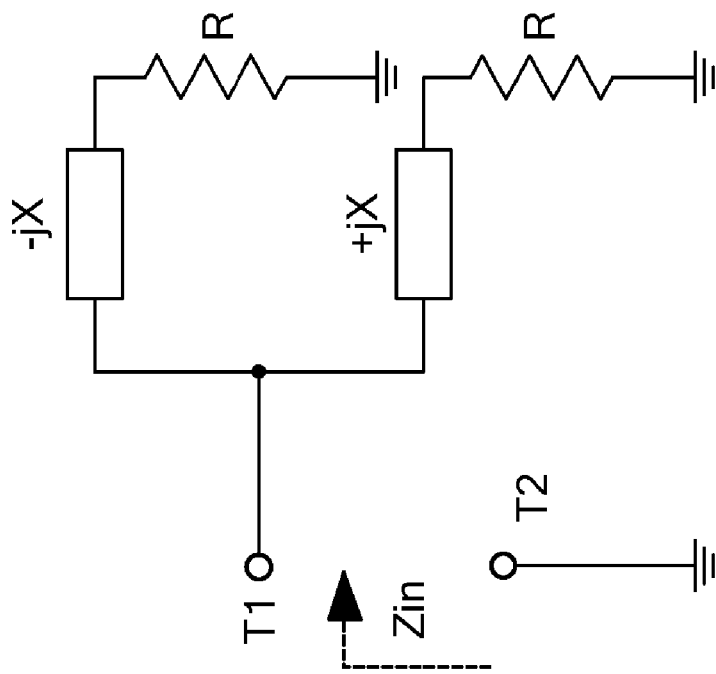
FIGS. 3A and 3B are circuit diagrams of resistance compression networks generalized from the circuits of FIGS. 2A and 2B.
Figure 3A:
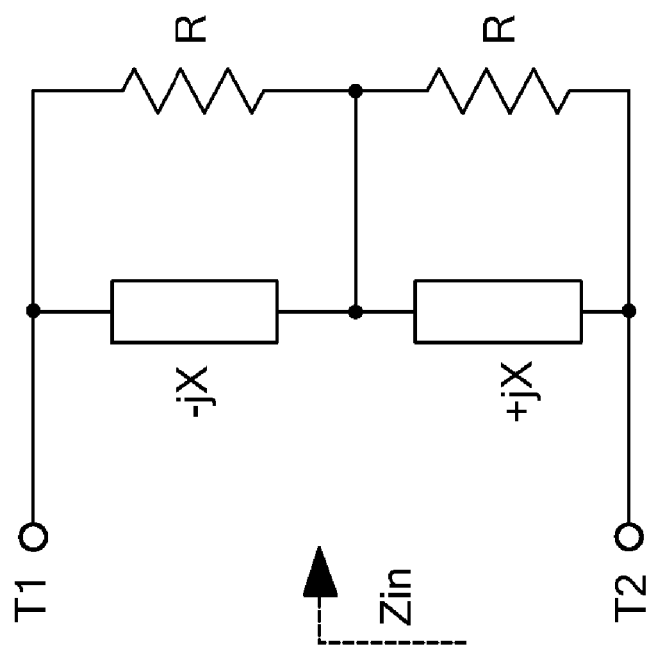

More generally, the compression networks of FIGS. 2A and 2B may be designed with generalized reactive branch networks as shown in FIGS. 3A and 3B. FIGS. 3A and 3B show the generalized structure of the circuits 100, 150 of FIGS. 2A and 2B providing resistance compression networks. The impedance of the reactive networks is specified at the desired operating frequency. Implementation of the reactive networks may be selected to provide desired characteristics at frequencies away from the operating frequency.

The reactive branch networks in FIGS. 3A and 3B are designed to have the specified reactance X at the designed operating frequency. For example, at this frequency the input impedance of the network in FIG. 2A will be resistive with a value:

$$R_{in} = \frac{2R}{1 + \left(\frac{R}{X}\right)^2} \quad (3)$$

which provides compression of the matched load resistances about a center value of impedance Zc=X. The impedances of these branches at other frequencies of interest (e.g. dc or at harmonic frequencies) can be controlled by how the branch reactances are implemented. Likewise, the resistance for the network of FIG. 2B will be:

$$R_{in} = \frac{X^2}{2R}\left[1 + \left(\frac{R}{X}\right)^2\right] \quad (4)$$

It should be noted that these networks can be cascaded to achieve even higher levels of resistance compression. For example, the resistances R1, R2 in FIGS. 3A,3B can each represent the input resistance of a subsequent resistance compression stage. An "N-stage" compression network would thus ideally have 2N load resistances that vary in a matched fashion. However, the efficacy of multiple-stage compression is likely to be limited by a variety of practical considerations.

Figure 4A:
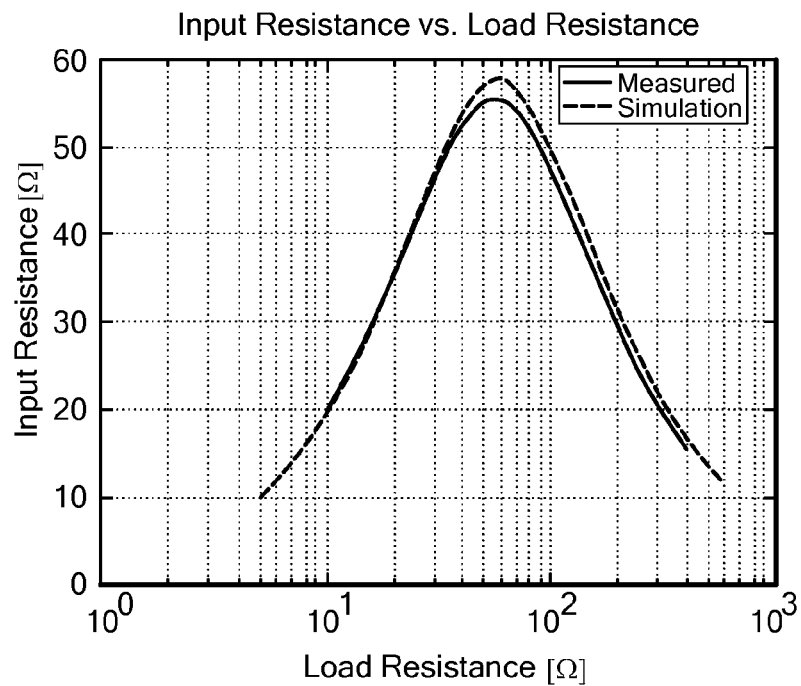
FIG. 4A is a graphical depiction of input resistance versus matched load resistance.
Figure 4B:
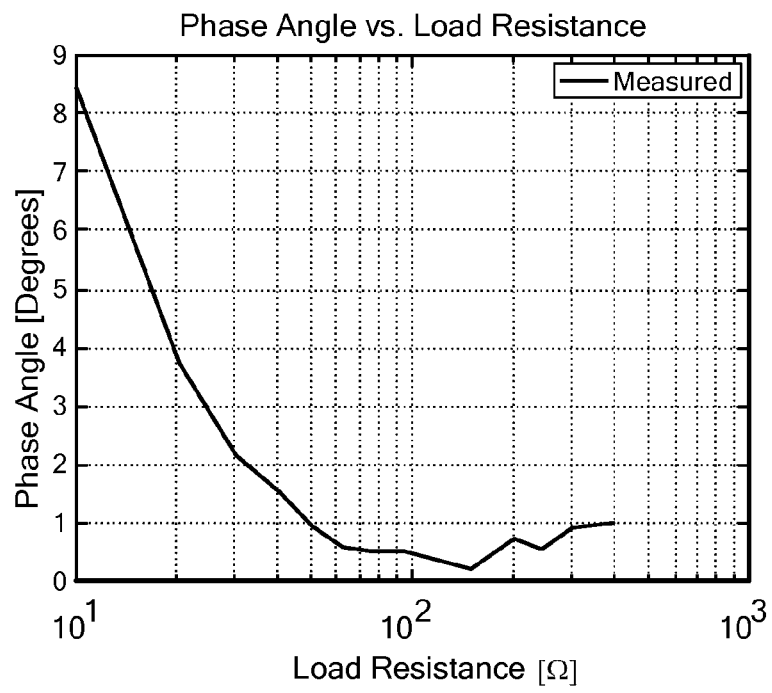
FIG. 4B is a graphical depiction of phase angle of input impendence versus matched load resistance.

FIGS. 4A and 4B show simulated and experimental results from a compression network of the type shown in FIG. 2A with component values shown in Table II.

TABLE II

COMPONENTS TO OBTAIN THE DATA IN FIGS. 4A AND 4B

| COMPONENT | VALUE | MANUFACTURER | PART NUMBER |
|---|---|---|---|
| C | 33 pF | CDE Chip Mica 100 V | MC08FA330J |
| L | 100 nH | Coilcraft | 1812SMS-R10 |

The network has a resonant frequency of 85.15 MHz and a characteristic impedance of 57.35Ω (slightly lower than nominal due to small additional parasitics). The anticipated compression in input resistance is achieved, with the measured reactive impedance at the operating frequency being negligible.

Figure 5B:
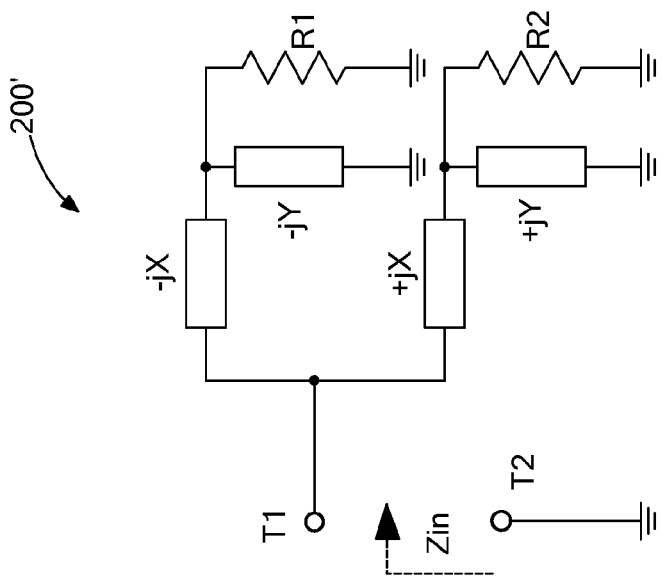
FIGS. 5A and 5B are generalized circuit diagrams of four-element compression networks.
Figure 5A:
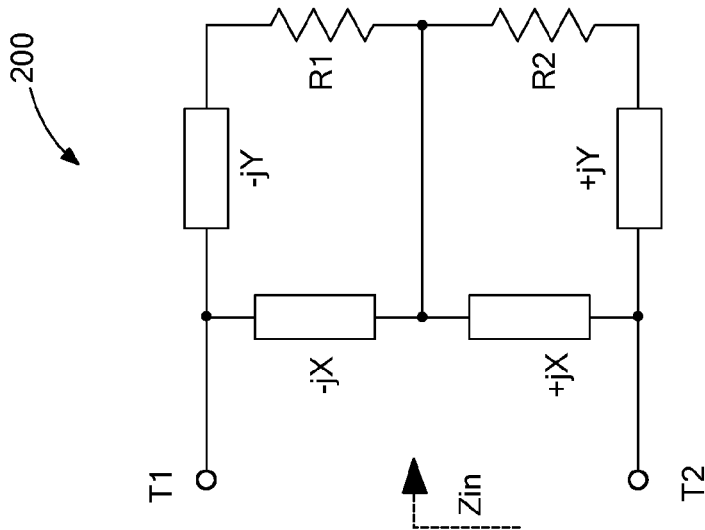

The networks of FIGS. 3A and 3B provide resistance compression about a specified value. It is also possible to achieve both resistance compression and impedance transformation in the same network. FIGS. 5A and 5B show first and second structures 200, 200' of four element compression/transformation networks. An upper circuit loop of the first circuit 200 includes reactances −jX, −jY and the first matched resistor R1 and a lower circuit loop includes reactances +jX, +jY and the second matched resistor R2.

Figure 6:
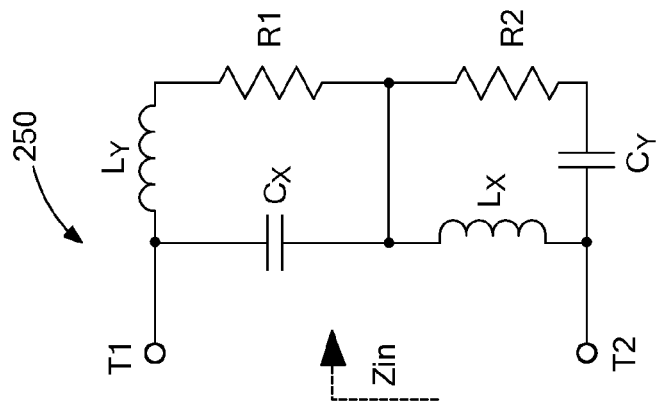
FIG. 6 is a circuit diagram of a four element compression network.

FIG. 6 shows a four-element compression network 250 having Cx, Ly, and R1 in the upper circuit loop and Cy, Lx and R2 in the lower circuit loop. As described more fully below, these networks can be designed to achieve both resistance compression and transformation of the resistance up or down by an amount only limited by efficiency requirements, component quality factor, and precision. As with the two-element networks, the input impedance remains entirely resistive over the whole load-resistance range.

Figure 7A:
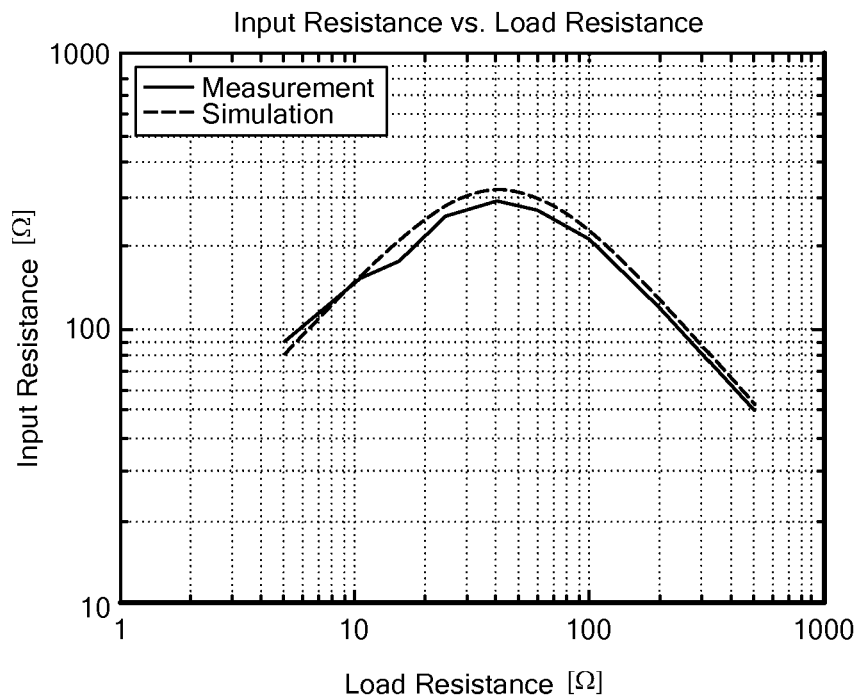
FIG. 7A is a graphical depiction of input resistance versus matched load resistance.
Figure 7B:
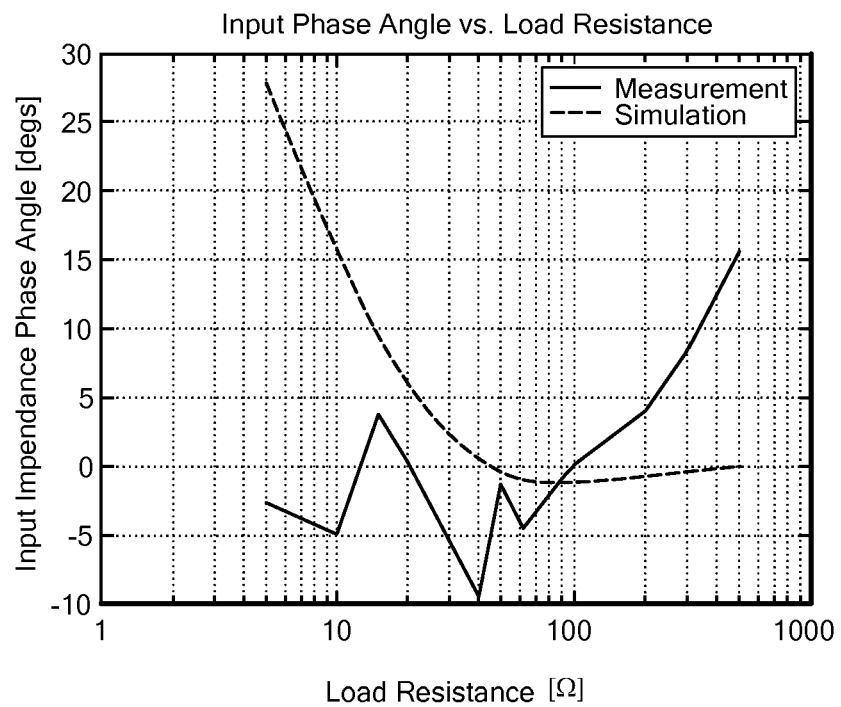
FIG. 7B is a graphical depiction of phase angle of input impedance versus matched load resistance.

FIGS. 7A and 7B show simulation and experimental measurements of the four element impedance compression network 250 of FIG. 6 operating at a frequency of 97.4 MHz which provides both compression and transformation for the circuit of FIG. 6 having values in Table III below.

TABLE III

COMPONENTS FOR DATA IN FIGS. 7A AND 7B

| COMPONENT | VALUE | MANUFACTURER | PART NUMBER |
|---|---|---|---|
| $C_X$ | 15 pF | CDE Chip Mica 100 V | MC08EA150J |

TABLE III-continued

COMPONENTS FOR DATA IN FIGS. 7A AND 7B

| COMPONENT | VALUE | MANUFACTURER | PART NUMBER |
|---|---|---|---|
| $C_Y$ | 8 pF | CDE Chip Mica 100 V | MC08CA080C |
|  | +2 pF |  | MC08CA020D |
|  | +1 pF |  | MC08CA010D |
| $L_X$ | 169 nH | Coilcraft | 132-12SM-12 |
| $L_Y$ | 246 nH | Coilcraft | 132-15SM-15 |

The load resistance is swept between 5 and 500 and presents a resistive input impedance over the whole range that varies between 50Ω and 290Ω.

The compression networks of FIGS. 3A and 3B also have an interesting effect when the matched load impedances are not perfectly resistive. In fact, as discussed further below, these networks can provide substantial "phase compression" of the input impedance (towards zero phase) for matched loads having an impedance magnitude near X but varying phase.

A resistance compression network can be combined with an appropriate set of rectifiers to yield an rf-to-dc converter with narrow-range resistive input characteristics. In order to obtain the desired compression effect, the rectifier circuits effectively act as a matched pair of resistances when connected to a compression network, such as the compression networks described above. A purely resistive input impedance can be achieved with a variety of rectifier structures. For example, in many diode rectifiers the fundamental ac voltage and current at the rectifier input port are in phase, though harmonics may be present.

Figure 8:
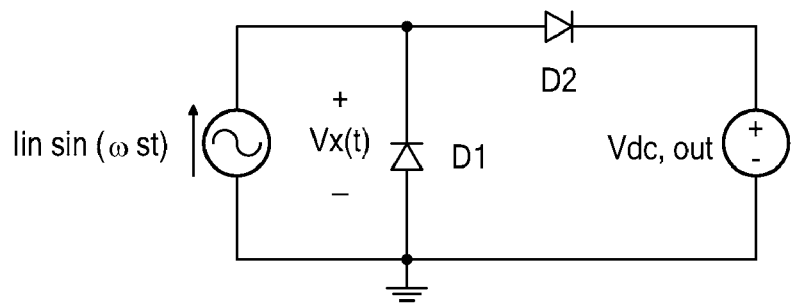
FIG. 8 is a circuit diagram of a half-wave rectifier.
Figure 9:
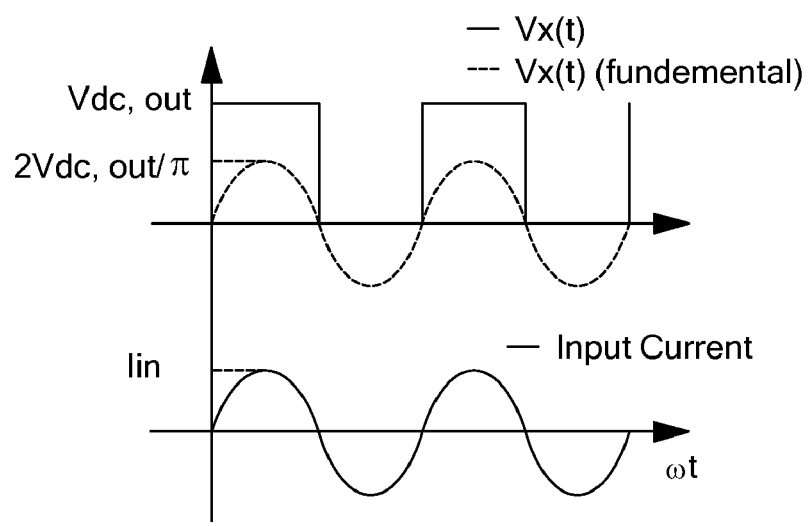
FIG. 9 is a waveform diagram for the rectifier of FIG. 8.

One example of this kind of rectifier structure is an ideal half bridge rectifier driven by a sinusoidal current source of amplitude $I_{in}$ and frequency $\omega_s$, and having a constant output voltage $V_{dc,out}$, as shown in FIG. 8. The voltage at the input terminals of the rectifier $v_x(t)$ will be a square wave having a fundamental component of amplitude $$V_{x1} = \frac{2V_{dc,out}}{\pi}$$

in phase with the input current $i_{in}(t)$, as shown in FIG. 9. The electrical behavior at fundamental frequency $\omega_s$ (neglecting harmonics) can be modeled as a resistor of value $$R_{eq} = \frac{2}{\pi}\frac{V_{out}}{I_{in}}.$$

Similarly, a full wave rectifier with a constant voltage at the output can be modeled at the fundamental frequency as a resistor $$R_{eq} = \frac{4}{\pi}\frac{V_{dc,out}}{I_{in}}.$$

There are other types of rectifier topologies that present the above-mentioned behavior; another example is the resonant rectifier. This type of rectifier also presents a resistive impedance characteristic at the fundamental frequency; furthermore, it requires only a single semiconductor device and incorporates the necessary harmonic filtering as part of its structure. Such a rectifier, when connected to a constant output voltage, presents a resistive equivalent impedance of the same magnitude as that of the full wave rectifier, $$R_{eq} = \frac{4}{\pi} \frac{V_{dc,out}}{I_{in}}.$$

Figure 10:
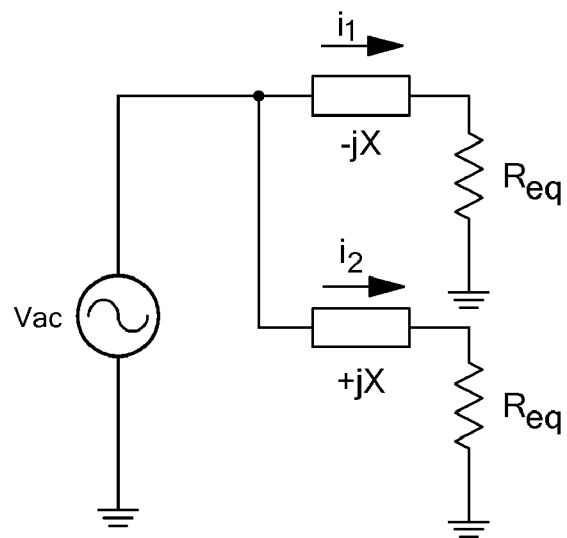
FIG. 10 is a generalized circuit diagram of a two-element compression network.

Driving this type of rectifier with a tuned network suppresses the harmonic content inherent in its operation and results in a resistive impedance characteristic at the desired frequency. This equivalent resistance can be represented by $$R_{eq} = \frac{k_{rect}}{|i_1|} V_{dc,out},$$

where $k_{rect}$ depends on the specific rectifier structure and $|i_1|$ is the fundamental component of the drive current. As shown below, when two identical such rectifiers feed the same dc output and are driven via reactances with equal impedance magnitudes (e.g., as in the circuits of FIGS. 3A, 3B), they act as matched resistors with values that depend on the dc output. Thus, a pair of such rectifiers can be used with a compression network to build a rectifier system having a resistive ac-side (input) characteristic that varies little as the dc-side operating conditions change. For example, one type of compression network/rectifier combination can be modeled as shown in FIG. 10.

One can express the magnitude of the current $i_1$ as:

$$|i_1| = \frac{V_{ac}}{\sqrt{X^2 + R_{eq}^2}} \quad (5)$$

where X is the reactance, Req is the equivalent resistance, and Vac is the ac voltage. By replacing $R_{eq}$ with its corresponding value $$R_{eq} = \frac{k_{rect}}{|i_1|} V_{dc,out},$$

one obtains:

$$|i_1| = \frac{V_{ac}}{\sqrt{X^2 + \frac{k_{rect}^2}{|i_1|^2} V_{dc,out}^2}} \quad (6)$$

Rearranging $|i_1|^2 X^2 + k_{rect}^2 V_{dc,out}^2 = V_{ac}^2$ (7)

Solving for $|i_1|$: $|i_1| = \sqrt{\frac{V_{ac}^2 - k_{rect}^2 V_{dc,out}^2}{X^2}}$ (8)

From this expression one can see that the branch current magnitude $|i_1|$ depends on the dc output voltage and the reactance magnitude. The branch carrying $|i_2|$ has the same reactance magnitude and output voltage, so both branches present identical effective load resistances.

For the rectifier structures that can be represented by an equivalent resistance of value $$R_{eq} = \frac{k_{rect}}{|i_1|} V_{dc,out}$$

one can express the equivalent resistances loading each branch as:

$$R_{eq} = \frac{k_{rect} V_{dc,out}}{\sqrt{\frac{V_c^2 - k_{rect}^2 V_{dc,out}^2}{X^2}}} = X \sqrt{\frac{1}{\left(\frac{v_{ac}}{k_{rect} V_{dc,out}}\right)^2 - 1}} \quad (9)$$

The net input resistance of the resistance-compressed rectifier set at the specific frequency will be determined in equation (4) where $R_{eq}$ for the rectifier replaces R.

Looking from the dc side of the resistance compressed rectifier one also sees interesting characteristics. For a given ac-side drive, a resistance-compressed rectifier will act approximately as a constant power source, and will drive the output voltage and/or current to a point where the appropriate amount of power is delivered.

In designing resistance compression networks and resistance compressed rectifiers there are some considerations that should be taken into account. The first consideration is how the compression network processes frequencies other than the operating frequency. When a compression network is loaded with rectifiers, the rectifiers typically generate voltage and/or current harmonics that are imposed on the compression network. It is often desirable to design the compression network to present high or low impedances to dc and to the harmonics of the operating frequency in order to block or pass them. Moreover, in some cases it may be important for the impedances of the two branches to be similar at harmonic frequencies in order to maintain balanced operation of the rectifiers.

To achieve this, it is often expedient to use multiple passive components to realize each of the reactances in the network (i.e., reactances ±jX in FIG. 3.) This strategy was employed in the compression network of the system in FIG. 15 described below.

A further design consideration is that of selecting a center impedance $Z_c$ for the compression. Typically, one places the center impedance at the geometric mean of the load resistance range to maximize the amount of compression. However, in some cases one might instead choose to offset the center impedance from the middle of the range. This might be done to make the input resistance of the compression network vary in a particular direction as the power level changes. Also, in systems that incorporate impedance or voltage transformation, different placements of the compression network are possible, leading to different possible values of $Z_C$. For example, one might choose to place a transformation stage before the compression network, on each branch after the compression network, or both. The flexibility to choose $Z_C$ in such cases can be quite valuable, since centering the compression network at too high or too low an impedance level can lead to component values that are either overly large or so small that they are comparable to parasitic elements.

An additional consideration is circuit quality factor and frequency sensitivity. Since compression networks operate on resonant principles, they tend to be highly frequency selective. This fact requires careful component selection and compensation for circuit parasitics in the design and layout of a compression network. Moreover, as with matching networks that realize large transformation ratios, compression networks realizing large degrees of compression require high quality-factor components. Component losses typically limit the practical load range over which useful compression may be achieved.

The resistance compression networks and resistance-compressed rectifiers described above have many potential applications, including radio-frequency rectifiers (e.g., for rectennas, or rectified antennas) and dc/dc converters operating at VHF and microwave frequencies. Here are described some motivations for their use in resonant dc/dc converters, along with a practical example of a resistance compressed rectifier in a 100 MHz dc/dc converter.

One motivation for resistance compression networks in rf-to-dc conversion applications that the compression network allows the rectifier system to appear as an approximately constant-resistance load independent of ac drive power or dc-side conditions. In rectenna applications this can be used to improve matching between the antenna and the rectifier. As will be shown, this is also useful for preserving efficient operation of resonant dc/dc converters as operating conditions change.

As described above, resonant dc/dc power converters include a resonant inverter, a rectifier, and a transformation stage to provide the required matching between the rectifier and the inverter. An inherent limitation of most resonant inverters suitable for VHF operation is their high sensitivity to loading conditions. This sensitivity arises because of the role the load plays in shaping converter waveforms. Consider, for example, a class E inverter designed to operate efficiently at a nominal load resistance. As the load resistance deviates substantially from its design value, the converter waveforms rapidly begin to deteriorate. As seen in the example drain-source waveforms of FIG. 11, the peak switch voltage rises rapidly when the resistance deviates in one direction 1. Moreover, zero-voltage turn-on of the device is rapidly lost for deviations in either direction.

There are a variety of reasons why maintaining near zero-voltage switch turn on is desirable in very high frequency power converters. First, the turn-on loss associated with the discharge of the capacitance across the switch is undesirable and eliminating this loss is often important for achieving acceptable efficiency. Second, a rapid drain voltage transition at turn on can affect the gate drive circuit through the Miller effect, increasing gating loss and possibly increasing switching loss due to the overlap of switch voltage and current. This issue can be of particular concern in circuits employing resonant gate drives, and in cases where the gate drive transitions are a significant fraction (e.g., 5%) of the switching cycle. Finally, zero-voltage switching avoids electromagnetic interference (EMI) and capacitive noise injection generated by rapid drain voltage transitions.

Figure 11:
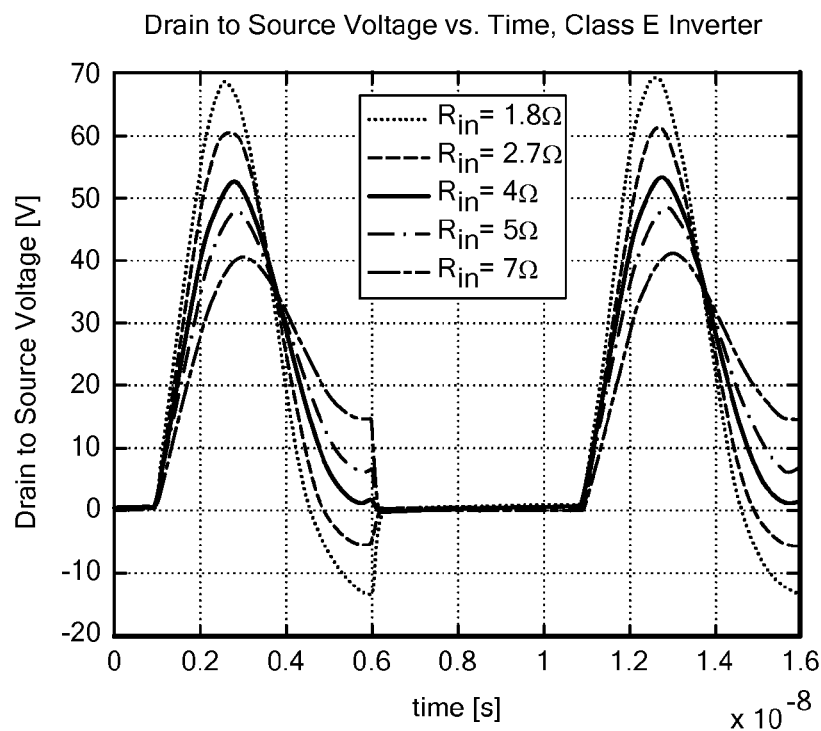
FIG. 11 is a graphical depiction of drain-to-source voltage versus time.

In view of the above considerations, there exist substantial limits on allowable load variations. In the example of FIG. 11, even if the maximum switch off-state voltage is allowed to increase and the switch voltage magnitude at turn on is allowed to be as large as the dc input voltage (a substantial deviation from zero-voltage switching), the permissible load resistance range is only a factor of approximately 3:1 (a range of 6 to 2 in FIG. 11). Requiring a closer approximation to zero-voltage turn on will necessitate maintaining a still narrower resistive load range.

This limitation in load range is further exacerbated in resonant dc/dc converters. As shown above, the effective resistance presented to the inverter typically depends on both ac drive levels (and hence on input voltage) and on the dc output of the rectifier. These dependencies pose a challenge to the design of resonant dc/dc converters at very high frequencies.

The high sensitivity of radio-frequency converters such as the class E inverter to variations in load resistance is a significant limitation, and motivates the development of circuit techniques to compensate for it.

Figure 15:
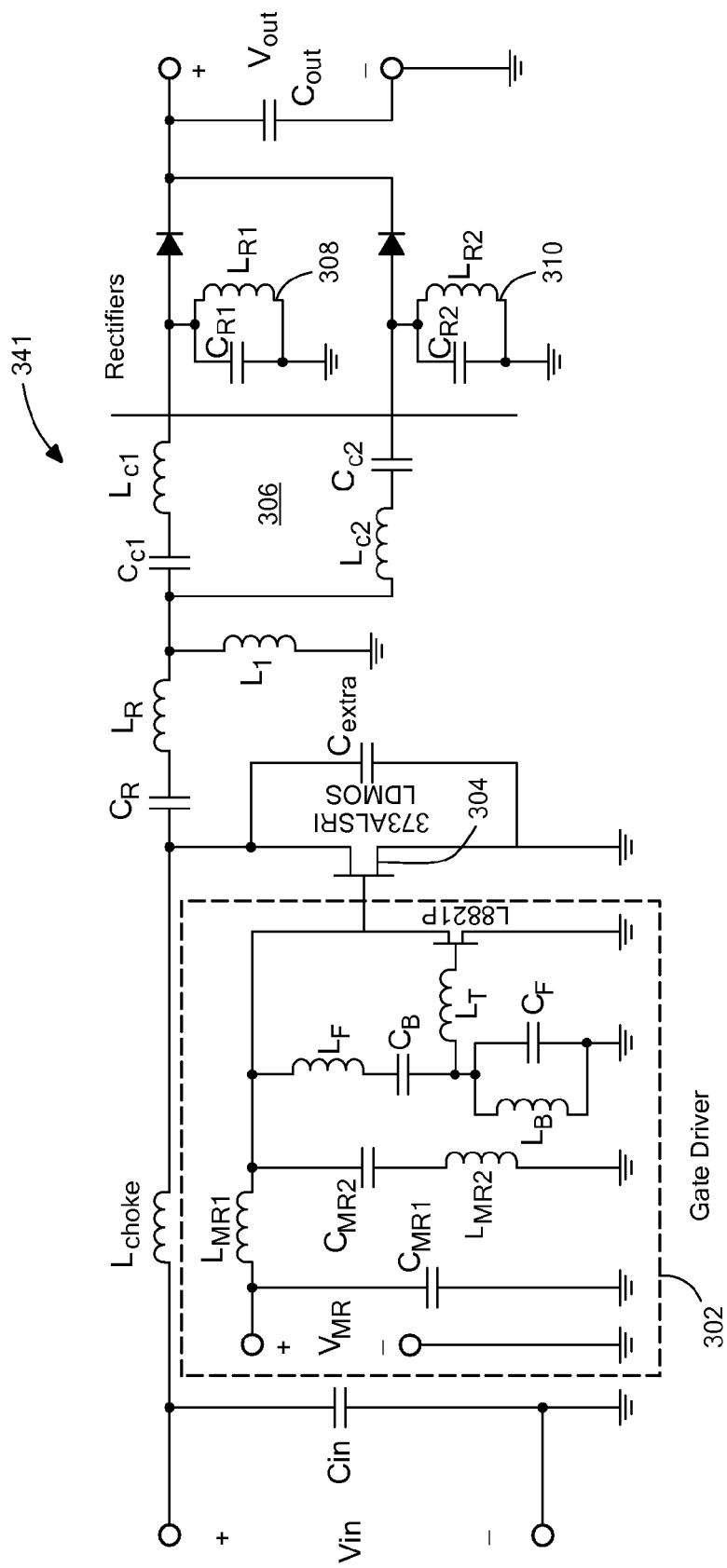
FIG. 15 is a circuit diagram of an exemplary dc/dc power converter having a resistance compression network.
Figure 16:
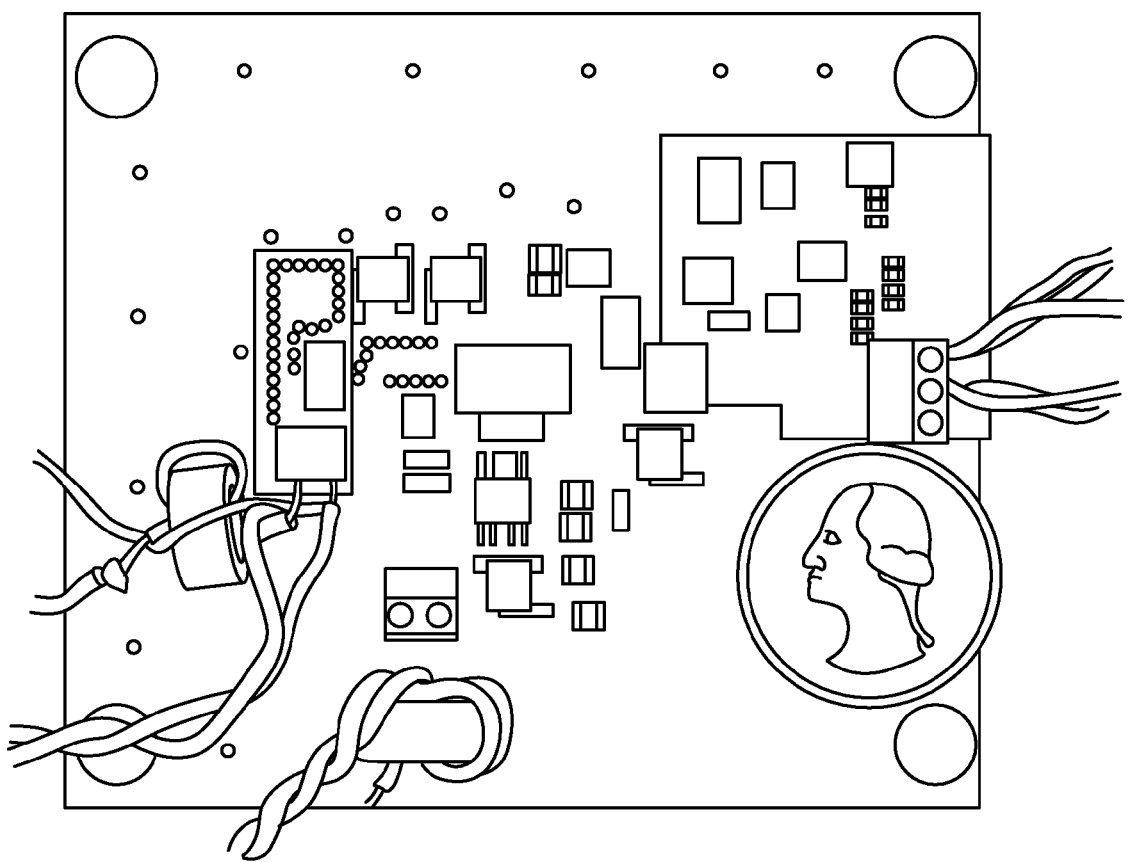
FIG. 16 is a pictorial representation of a prototype dc/dc power converter.

To demonstrate the use of resistance compression to benefit very high frequency dc/dc power converters, a prototype dc/dc converter operating at 100 MHz was developed. The circuit includes a class E inverter with self-oscillating gate drive, a matching network, a resistance compression network of the type shown in FIG. 3B, and a set of two resonant rectifiers which have a resistive characteristic at the fundamental frequency. The switching frequency for the converter is 100 MHz, the input voltage range is $11V \leq V_{in,dc} \leq 16V$ and the maximum output power capability ranges from 11.4 W at $V_{in,dc}=11V$ to 24.5 W at $V_{in,dc}=16V$. The detailed schematic of the circuit implementation is shown in FIG. 15 and the components used are listed in FIG. 15A. A pictorial representation of the prototype converter is shown in FIG. 16.

The converter 300 of FIG. 15 includes an exemplary gate driver circuit 302 for a switching device 304, shown as a LDMOSFET. An LC tank circuit includes a capacitor $C_R$ and an inductor $L_R$. coupled to a matching inductor $L_1$ an inductor L1. The two element compression network 306 includes Cc1 and Lc1 (−jX in FIG. 3B) in a first path and Lc2 and Cc2 (+jX) in a second path. The first path is coupled to a first rectifier 308 and the second path is coupled to a second rectifier 310.

In order to minimize the gating losses of the LDMOSFET 304, a self-oscillating multi-resonant gate drive 302 was used. This gate driver 302 is selected to provide a gate to source voltage with a pseudo-square wave characteristic that provides fast and efficient commutation of the main semiconductor device without driving the gate-source voltage negative. The average power dissipated in the resonant driver was found to be 350 mW.

Each of the two resonant rectifiers 308, 310 in FIG. 15 are designed to appear resistive in the sense that the fundamental ac voltage at the rectifier input is largely in phase with the drive current when the rectifier is driven from a sinusoidal current. (The compression network reactances are designed to block the voltage harmonics created by the rectifiers.) At $V_{dc,out}=12V$, each rectifier 308, 310 is designed to present an equivalent resistance (at the fundamental) ranging from 12Ω (at an output power of 13.8 W) to 27.4Ω (at an output power of 5.75 W).

The compression network is designed for a nominal operating frequency of 100 MHz and a center impedance Zc=20Ω. Simulations predict a compressed resistance ranging from 21Ω down to 20Ω and back up to 22.7Ω as power ranges from minimum to maximum. Moreover, the compression network is designed to present a high impedance to dc and harmonics of the fundamental.

To enable the compression network 306 and rectifiers 308, 310 to operate at a convenient impedance level, an L-section matching network is used. The network comprises shunt inductance L1, with the capacitive portion of the L-section matching network absorbed as part of the resonant capacitor $C_R$.

Figure 12:
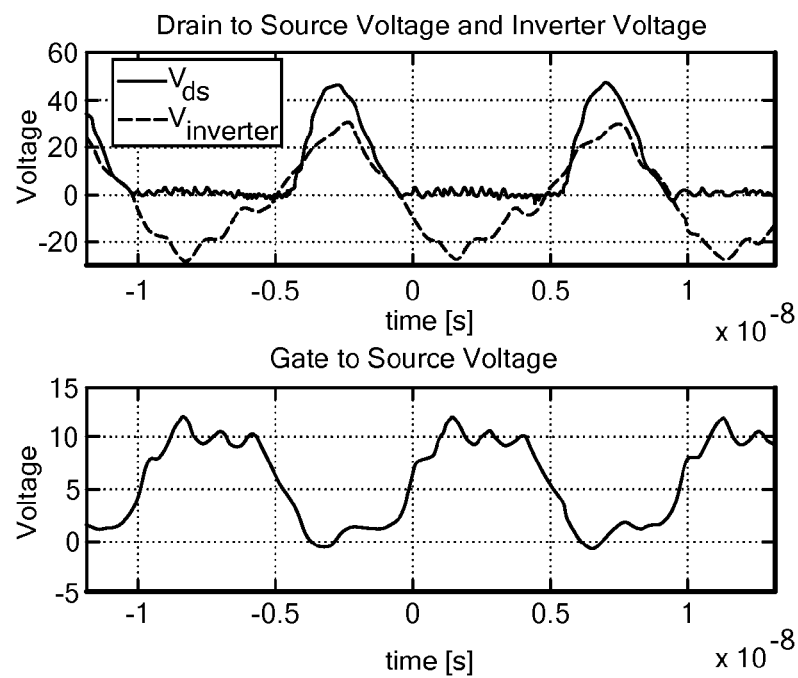
FIG. 12 is a graphical depiction of waveforms for a converter.

Experimental results support the efficacy of the compression network for providing a desired narrow-range impedance to the inverter as the power level varies with input voltage. FIG. 12 shows experimental waveforms for the converter running at $V_{in,dc}=11V$ and $V_{out,dc}=12V$. Shown in the figure are the voltage at the gate of the MOSFET, the drain to source voltage of the device and the voltage at the input of the compression network. It can be appreciated from the figure that zero-voltage turn-on of the LDMOSFET 304 is achieved, indicating a proper impedance match.

Figure 13:
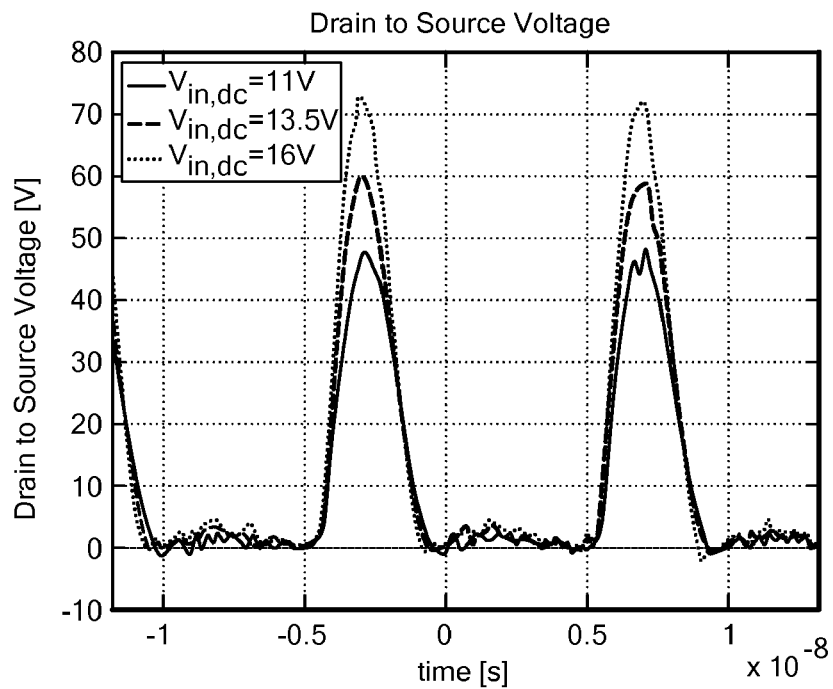
FIG. 13 is a graphical depiction of drain-to-source voltage versus time.

FIG. 13 shows Vds at input voltages of 11V, 13.5V, and 16V. As can be appreciated from the respective figures, the zero-voltage condition is achieved over the whole input voltage range: a situation that would not occur without the resistance compression network operating as desired.

Figure 14:
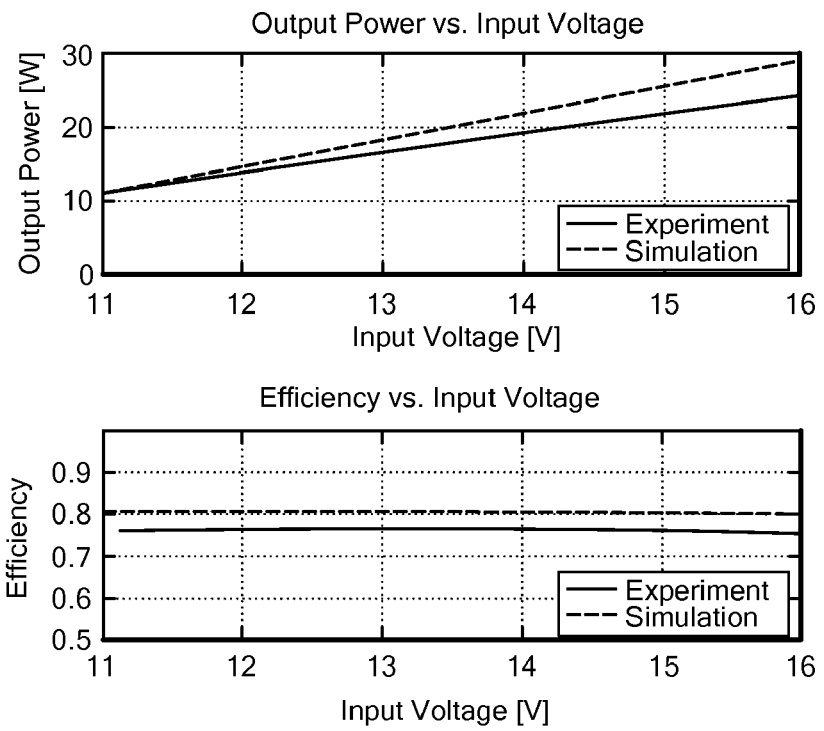
FIG. 14 is a graphical depiction of output power and efficiency.

FIG. 14 shows the output power and the efficiency of the prototype converter. It can be appreciated that the output power has a characteristic roughly proportional to the square of the input voltage, another indication that the compression network is functioning to keep the effective load resistance constant as operating conditions change.

The present invention provides inventive matching networks that deliver a significant reduction in the load sensitivity of resonant converters and rf amplifiers. These networks, termed resistance compression networks, serve to greatly decrease the variation in effective resistance seen by a tuned rf inverter as loading conditions change.

As described above, four-element resistance compression networks provide an additional degree of design freedom that can be used to implement impendence transformation along with resistance compression. Consider the four-element compression network of FIG. 5A, where the values X and Y are the reactances of the network branches at the desired operating frequency. Straightforward analysis shows that the input impedance of the network at the specified frequency is resistive having a value defined as:

$$R_{in} = \frac{X^2}{(X+Y)^2} \cdot \frac{2R}{1+\left(\frac{R}{X+Y}\right)^2} \quad (10)$$

Examining this equation one can identify a center impedance Zc=X+Y about which compression of the matched resistances occurs. Moreover, one can identify a transformation factor KT, defined as:

$$K_T = \frac{X^2}{(X\|Y)^2} \quad (11)$$

The transformation factor KT can be observed to be an additional factor by which the input impedance $R_{in}$ is scaled (transformed) as compared to the two-element matching network of FIG. 3A, as set forth below:

$$K_T = \frac{R_{in}}{Z_c}\bigg|_{R=Z_c} \quad (12)$$

There are two distinct possibilities with this four element matching network. If reactances X and Y have the same sign (that is, both reactances are inductive or both are capacitive at the operating frequency) then $K_T$ will be less than one, and there will be a downward transformation from Zc to Rin. Conversely, if X and Y have opposite sign (one is inductive and the other capacitive) $K_T$ will be greater than one, and there will be an upward impedance transformation from $Z_c$ to $R_{in}$.

The four-element compression network of FIG. 5B can similarly provide transformation along with compression. In particular the input resistance presented by this network is:

$$R_{in} = \frac{1}{2R}X^2 \cdot \left[1 + \left(\frac{R}{X\|Y}\right)^2\right] \quad (13)$$

The center impedance about which compression will occur is Zc=X∥Y. The transformation ratio KT is:

$$K_T = \frac{X^2}{(X\|Y)^2} \quad (14)$$

The behavior of the compression networks of FIGS. 3A and 3B when the (matched) load impedances are not purely resistive is now considered. As will be shown, if the matched loads are both resistive and reactive, the resistance compression network can serve to transform the load impedances in a manner that makes the network impedance more resistive than the loads, thus providing "phase compression" of the load impedance.

Figure 17B:
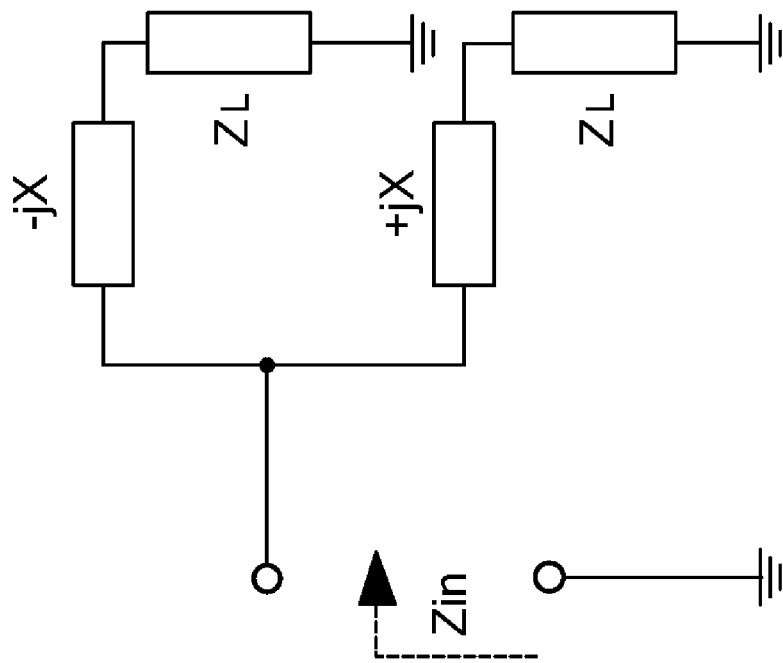
FIGS. 17A and 17B are generalized circuit diagrams of impedance compression networks terminated in matched non-resistive loads.
Figure 17A:
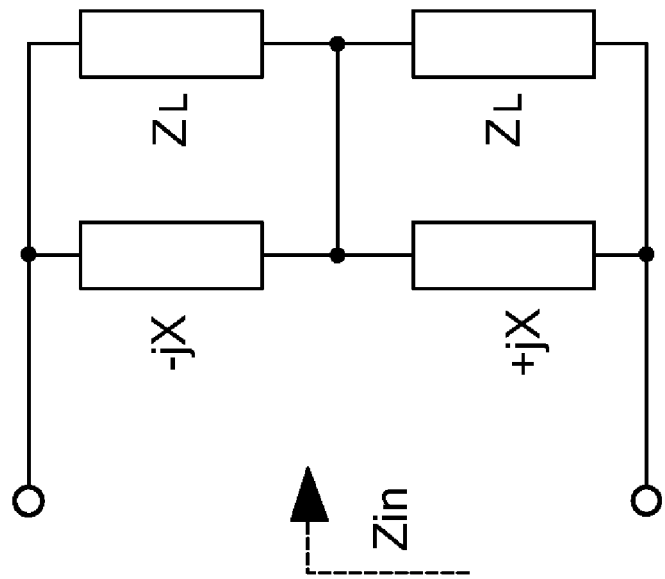

FIGS. 17A and 17B shows the compression networks of FIG. 3, with the load resistances replaced by complex impedances. For example, in FIG. 17A, the load impedance can be expressed as:

$$Z_L = R_L + jX_L = |Z_L|\angle\alpha \quad \text{at} \quad \omega = \omega_0 \quad (15)$$

$$|Z_L| = \sqrt{R_L^2 + X_L^2} \text{ and } \tan\alpha = \frac{X_L}{R_L} \quad (16)$$

The input impedance at $\omega=\omega_0$ can be expressed as:

$$Z_{IN} = |Z_{in}|\angle\theta = \frac{2X^2[R_L(X^2+|Z_L|^2)+jX_L(X^2-|Z_L|^2)]}{[R_L^2+(X_L+X)^2][R_L^2+(X_L-X)^2]} \quad (17)$$

$$\tan\theta = \frac{X_L}{R_L}\left[\frac{X^2-|Z_L|^2}{X^2+|Z_L|^2}\right] = \tan\alpha\left[\frac{X^2-|Z_L|^2}{X^2+|Z_L|^2}\right] \quad (18)$$

Since $$\frac{X^2-|Z_L|^2}{X^2+|Z_L|^2} < 1,$$

one finds |θ|<|α|. That is, the magnitude of the input impedance phase angle θ is less than the magnitude of the load phase angle α, thus providing "phase compression".

$$\frac{\tan\theta}{\tan\alpha} = \frac{X^2-|Z_L|^2}{X^2+|Z_L|^2} \quad (19)$$

If the magnitude of the matched load impedances equals that of the compression network reactances (|ZL|=X), the input impedance is totally resistive for any load phase angle, which means the load reactive component is eliminated. As the magnitude of the matched load impedances deviates from those of the compression network, the compression effect decreases. The amount of phase angle compression achieved for several load impedances is illustrated in Table V.

TABLE V

|  | $-30° \leq \alpha \leq 30°$ | $-45° \leq \alpha \leq 45°$ | $-60° \leq \alpha \leq 60°$ |
|---|---|---|---|
| $\|Z_L\| = X$ | $\theta = 0°$ | $\theta = 0°$ | $\theta = 0°$ |
| $\|Z_L\| = 0.75X$ or $1.33X$ | $-9.2° \leq \theta \leq 9.2°$ | $-15.6° \leq \theta \leq 15.6°$ | $-25.9° \leq \theta \leq 25.9°$ |
| $\|Z_L\| = 0.5X$ or $2X$ | $-19.1° \leq \theta \leq 19.1°$ | $-31.0° \leq \theta \leq 31.0°$ | $-46.1° \leq \theta \leq 46.1°$ |

Figure 18A:
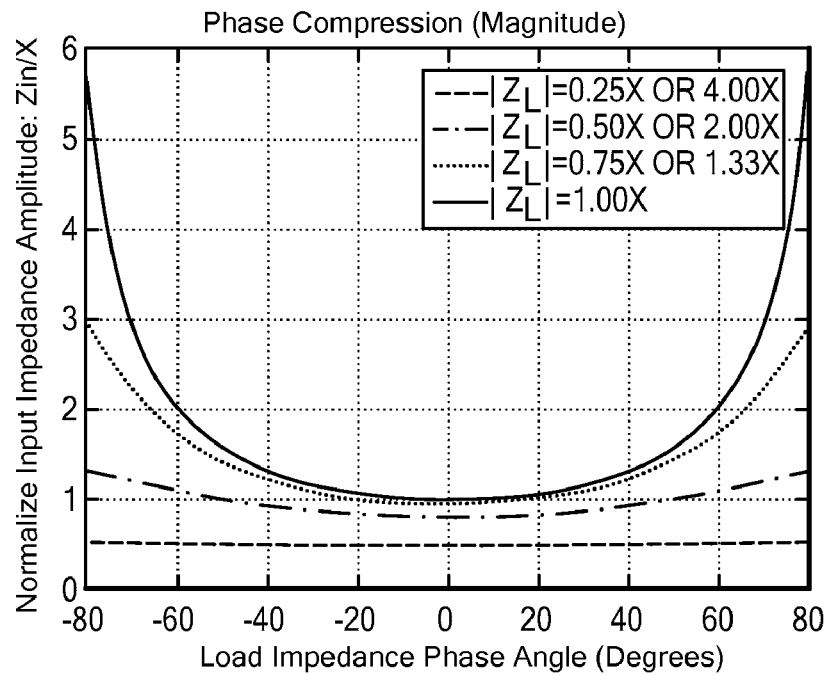
FIG. 18A is a graphical depiction of impendence amplitude magnitude for the topology of FIG. 17A.
Figure 18B:
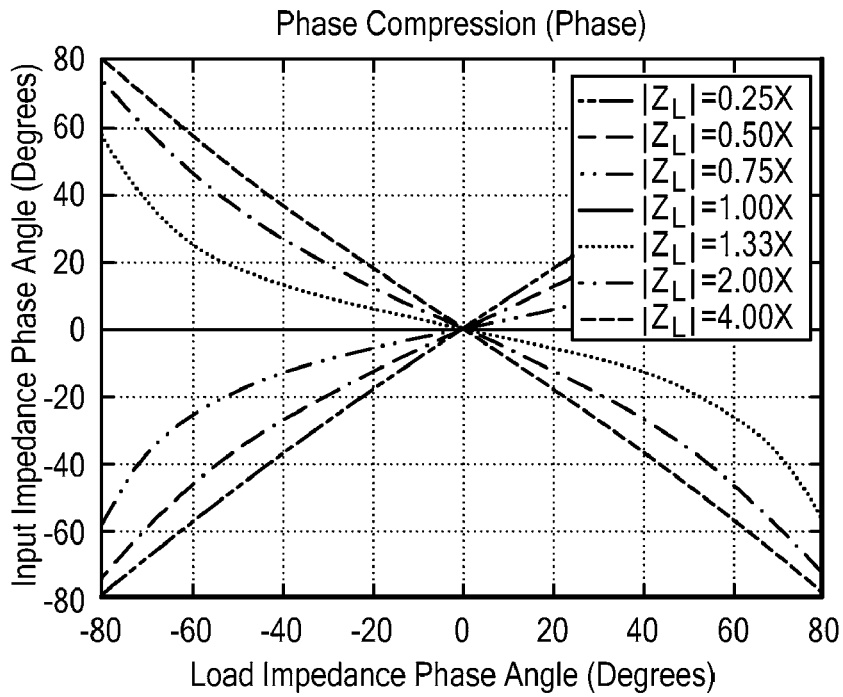
FIG. 18B is a graphical depiction of impendence phase in phase for the topology of FIG. 17A.

FIG. 18 plots the normalized magnitude and phase of Zin as a function of load impedance phase α for the circuit of FIG. 17A. The compression in input impedance magnitude and phase achieved with different load impedance magnitudes can be observed.

The input impedance for the compression network of FIG. 17B is:

$$Z_{in} = |Z_{in}| \angle \theta = \frac{R_1(|Z_L|^2 + X^2) + jX_L(|Z_L|^2 - X^2)}{2|Z_L|^2} \quad (20)$$

This circuit likewise provides compression of the input impedance angle, with a measure of compression given by:

$$\frac{\tan \theta}{\tan \alpha} = \frac{|Z_L|^2 - X^2}{X^2 + |Z_L|^2} \quad (21)$$

Figure 19A:
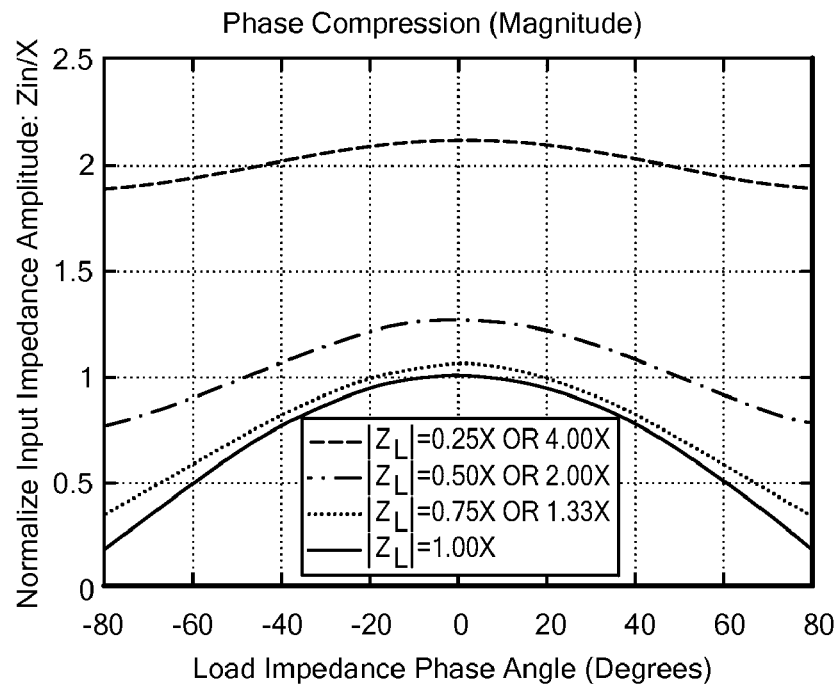
FIG. 19A is a graphical depiction of impendence amplitude magnitude for the topology of FIG. 17B.
Figure 19B:
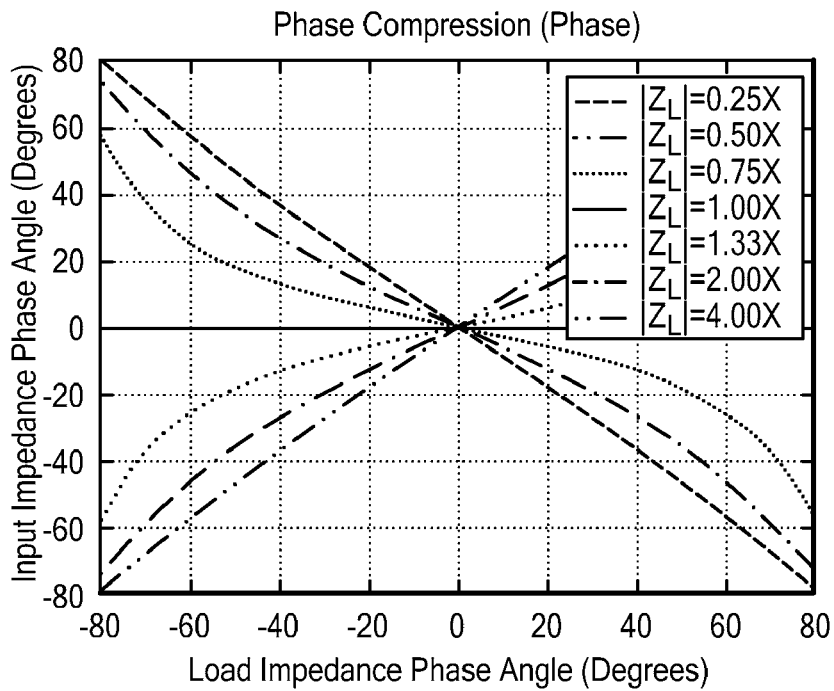
FIG. 19B is a graphical depiction of impendence in phase for the topology of FIG. 17B.

FIG. 19 shows the normalized magnitude and phase of FIG. 17B as load impedance angle varies. The anticipated compression in load phase angle is achieved with different loads.

As detailed above, the compression networks of FIGS. 17A, 17B can provide a limited degree of compensation for nonresistive characteristics of the matched loads. The input impedance of the compression network will be more closely resistive than that of the loads. This effect is quite pronounced for load impedance magnitudes near the impedance magnitude of the compression network.

One skilled in the art will appreciate further features and advantages of the invention based on the above-described embodiments. Accordingly, the invention is not to be limited by what has been particularly shown and described, except as indicated by the appended claims. All publications and references cited herein are expressly incorporated herein by reference in their entirety.

What is claimed is:

1. A circuit comprising:
   first and second loads having equivalent resistances at a first frequency that vary in a substantially identical fashion over a range of at least 2:1; and
   a resistance compression network including:
      an input port;
      a first output port for coupling to the first load;
      a second output port for coupling to the second load; and
      a reactive network coupled to the first input port, the first output port, and the second output port,
   wherein at the first frequency an equivalent resistance of the compression network input port varies over a first ratio as equivalent resistances of the first and second loads vary together over a second ratio which is larger than the first ratio.

2. The circuit of claim 1 wherein the reactive network includes:
   a first reactive branch in series with the first load, and
   a second reactive branch in series with the second load,
   wherein the reactances of the first and second reactive branches are substantially equal in magnitude and opposite in sign at the first frequency.

3. The circuit of claim 2 wherein the reactive network further includes:
   a third reactive branch in parallel with the series connection of the first reactive branch and the first load, and
   a fourth reactive branch in parallel with the series connection of the second reactive branch and the second load,
   wherein the third and fourth reactive branches connect at a circuit node,
   wherein the reactances of the third and fourth reactive branches are substantially equal in magnitude and opposite in sign at the first frequency.

4. The circuit of claim 2 wherein
   a first terminal of the first reactive branch and a first terminal of the second reactive branch are each coupled to a first terminal of the input port,
   a second terminal of the first reactive branch is coupled to a first terminal of the first load,
   a second terminal of the second reactive branch is coupled to a first terminal of the second load, and
   a second terminal of the first load and a second terminal of the second load are each coupled to a second terminal of the input port.

5. The circuit of claim 1 wherein the reactive network further includes:
   a first reactive branch in parallel with the first load, and
   a second reactive branch in parallel with the second load,
   wherein the reactances of the first and second branches are substantially equal in magnitude and opposite in sign at the first frequency.

6. The circuit of claim 5 wherein the reactive network further includes:
   a third reactive branch in series with the parallel connection of the first reactive branch and the first load, and
   a fourth reactive branch in series with the parallel connection of the second reactive branch and the second load,
   wherein the reactances of the third and fourth reactive branches are substantially equal in magnitude and opposite in sign at the first frequency,
   wherein a first terminal of the third reactive branch and a first terminal of the fourth reactive branch are each coupled to a first terminal of the input port, and
   a second terminal of the first reactive branch, a second terminal of the first load, a second terminal of the second reactive branch and a second terminal of the second load are coupled to a second terminal of the input port.

7. The circuit of claim 5 wherein
   a first terminal of the first reactive branch and a first terminal of the first load are each coupled to a first terminal of the input port,
   a first terminal of the second reactive branch and a first terminal of the second load are each coupled to a second terminal of the input port, and
   a second terminal of the first reactive branch, a second terminal of the first load, a second terminal of the second reactive branch and a second terminal of the second load are coupled together.

8. The circuit of claim 1, wherein the first load includes a rectifier.

9. The circuit of claim 8, wherein the rectifier presents a voltage and current at the first frequency that are in phase.

10. The circuit according to claim 9, further including an inverter coupled to the input port of the resistance compression network.

11. The circuit according to claim 1, wherein the compression network includes a resonant tank circuit.

12. The circuit of claim 1, wherein input characteristics of the first and second loads vary in a matched fashion as operating conditions change.

13. A circuit, comprising:
an inverter circuit;
a resistance compression network including an input port and first and second output ports, and a reactive network, the input port coupled to the inverter circuit;
the reactive network coupled to the first input port and the first and second output ports; and
a first rectifier coupled to the first output port and a second rectifier coupled to the second output port,
wherein at a first frequency an equivalent resistance of the compression network input port varies over a first ratio as equivalent resistances of the first and second rectifiers vary together over a second ratio which is larger than the first ratio.

14. The circuit according to claim 13, wherein the inverter is a resonant inverter and the compression network includes a resonant tank circuit.

15. The circuit according to claim 13, wherein the first and second rectifiers provide a substantially resistive load at the first frequency.

16. The circuit according to claim 13, wherein compression of the resistances of the first and second rectifiers is about a center value of impedance corresponding to a reactive component of the reactive network.

17. A method, comprising:
coupling reactive elements to form a resistance compression network, the compression network having an input port and first and second output ports, the first output port being adapted for coupling to a first load and the second output port being adapted for coupling to a second load; wherein the first and second loads have equivalent resistances at a first frequency that vary in a substantially identical fashion over a range of at least 2:1;
wherein at a first frequency an equivalent resistance of the compression network input port varies over a first ratio as equivalent resistances of the first and second loads vary together over a second ratio which is larger than the first ratio.

18. The method according to claim 17, further including
coupling a first reactive branch in series with the first load, and a second reactive branch in series with the second load,
wherein the reactances of the first and second reactive branches are substantially equal in magnitude and opposite in sign at the first frequency.

19. The method according to claim 18, further including
coupling a third reactive branch in parallel with the series connection of the first reactive branch and the first load, and a fourth reactive branch in parallel with the series connection of the second reactive branch and the second load, wherein a node is formed at a connection of the third and fourth reactive branches
wherein the reactances of the third and fourth reactive branches are substantially equal in magnitude and opposite in sign at the first frequency.

20. The method according to claim 18, further including
coupling a first terminal of the first reactive branch and a first terminal of the second reactive branch to a first terminal of the input port,
coupling a second terminal of the first reactive branch to a first terminal of the first load,
coupling a second terminal of the second reactive branch to a first terminal of the second load, and
coupling a second terminal of the first load and a second terminal of the second load to a second terminal of the input port.

21. The method according to claim 17, further including:
coupling a first reactive branch in parallel with the first load, and a second reactive branch in parallel with the second load, wherein the reactances of the first and second branches are substantially equal in magnitude and opposite in sign at the first frequency.

22. The method of claim 21, further including
coupling a third reactive branch in series with the parallel connection of the first reactive branch and the first load, and a fourth reactive branch in series with the parallel connection of the second reactive branch and the second load, wherein a node is formed at a point between the third and fourth reactive branches,
wherein the reactances of the third and fourth reactive branches are substantially equal in magnitude and opposite in sign at the first frequency.

23. The method according to claim 21, further including
coupling a first terminal of the first reactive branch and a first terminal of the first load to a first terminal of the input port,
coupling a first terminal of the second reactive branch and a first terminal of the second load to a second terminal of the input port, and
coupling together a second terminal of the first reactive branch, a second terminal of the first load, a second terminal of the second reactive branch and a second terminal of the second load.

24. A circuit, comprising:
first and second loads having equivalent resistances at a first frequency that vary in a substantially identical fashion over a range of at least 2:1;and
a resistance compression network having an input port and first and second output ports, the first output port to drive the first load and the second output port to drive the second load, the first input port having an input impedance at the first frequency that varies a first amount as impedances of the first and second loads vary substantially together by a second amount that is greater than the first amount.

25. The circuit of claim 24, wherein power delivered to the input port of the resistance compression network is substantially losslessly transferred to the first and second loads.

26. The circuit according to claim 24, wherein the first load includes a rectifier.

27. The circuit according to claim 24, further including an inverter coupled to the compression network.

* * * * *

UNITED STATES PATENT AND TRADEMARK OFFICE
CERTIFICATE OF CORRECTION

PATENT NO. : 7,535,133 B2  Page 1 of 1
APPLICATION NO. : 11/381418
DATED : May 19, 2009
INVENTOR(S) : Perreault et al.

It is certified that error appears in the above-identified patent and that said Letters Patent is hereby corrected as shown below:

Col. 6, line 31, delete "is tabular" and replace with -- is a tabular --.

Col. 6, line 38, delete "impendence" and replace with -- impedance --.

Col. 6, line 40-41, delete "impendence" and replace with -- impedance--.

Col. 6, line 40-41, delete "phase in phase" and replace with -- phase-in-phase --.

Col. 6, line 42, delete "impendence" and replace with -- impedance --.

Col. 6, line 44, delete "impendence" and replace with -- impedance --.

Col. 6, line 45, delete "FIG. 17B;" and replace with -- FIG. 17B. --.

Col. 13, line 18, delete "applications that" and replace with -- applications is that --.

Col. 14, line 26, delete "an inductor L1".

Col. 14, line 33, delete "gate to source" and replace with -- gate-to-source --.

Col. 14-15, line 67-1, delete "drain to source" and replace with -- drain-to-source --.

Col. 15, line 25, delete "impendance" and replace with -- impedance --.

Col. 15, line 65, delete "sign" and replace with -- signs --.

Col. 19, line 46, delete "a first" and replace with -- the first --.

Signed and Sealed this

Eleventh Day of August, 2009

David J. Kappos
*Director of the United States Patent and Trademark Office*

Disclaimer

7,538,133 — Takehiko Naka, Higashinada-ku (JP); Kohei Nishikawa, Nishikyo-ku (JP); Takeshi Kato, Higashiosaka (JP), BENZIMIDAZOLE DERIVATIVES, THEIR PRODUCTION AND USE. Patent dated May 26, 2009. Disclaimer filed Aug. 5, 2009, by the assignee, Takeda Pharmaceutical Company Limited.

The term of this patent shall not extend beyond the expiration date of Pat. No. 7,538,138.
(*Official Gazette*, October 27, 2009)